(12) United States Patent
Rosenberg

(10) Patent No.: US 7,418,176 B2
(45) Date of Patent: Aug. 26, 2008

(54) ALIGNMENT OF OPTOELECTRONIC COMPONENTS USING A COMPOSITE ADHESIVE

(75) Inventor: Paul K. Rosenberg, Sunnyvale, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/468,629

(22) Filed: Aug. 30, 2006

(65) Prior Publication Data

US 2007/0058903 A1     Mar. 15, 2007

Related U.S. Application Data

(62) Division of application No. 11/187,264, filed on Jul. 22, 2005, now Pat. No. 7,286,736.

(60) Provisional application No. 60/590,091, filed on Jul. 22, 2004.

(51) Int. Cl.
  *G02B 6/42* (2006.01)
(52) U.S. Cl. .................. 385/52; 385/93; 385/94

(58) Field of Classification Search .............. None
  See application file for complete search history.

(56) References Cited

U.S. PATENT DOCUMENTS

| | | | | |
|---|---|---|---|---|
| 5,936,263 | A * | 8/1999 | Hashizume | 385/92 |
| 6,513,991 | B1 * | 2/2003 | Kowalski | 385/92 |
| 6,728,450 | B2 | 4/2004 | Tombling et al. | |
| 2003/0118292 | A1 * | 6/2003 | Kitaoka et al. | 385/91 |
| 2004/0042736 | A1 | 3/2004 | Capewell et al. | |

\* cited by examiner

*Primary Examiner*—Sung Pak
*Assistant Examiner*—Chad H Smith
(74) *Attorney, Agent, or Firm*—Workman Nydegger

(57) ABSTRACT

Optical components are aligned within an optoelectronic device using a composite adhesive material. An optical subassembly of the optoelectronic device includes a package housing, an optical component, and a composite adhesive that at least indirectly maintains the optical component in a predetermined position on a mounting surface within the package housing. The composite adhesive includes an adhesive substance, and a plurality of spacing elements intermixed in the adhesive substance. The spacing elements at least indirectly space the optical component from a designated surface of the package housing such that the component is positioned in the predetermined position.

13 Claims, 5 Drawing Sheets

ALIGNMENT OF OPTOELECTRONIC COMPONENTS USING A COMPOSITE ADHESIVE

CROSS-REFERENCE TO RELATED APPLICATIONS

This patent application is a divisional of U.S. patent application Ser. No. 11/187,264, filed Jul. 22, 2005, which claims the benefit of U.S. Provisional Patent Application No. 60/590,091, filed Jul. 22, 2004. The foregoing patent applications are incorporated herein by reference.

BACKGROUND

1. The Field of the Invention

The present invention is generally directed to optoelectronic devices. More particularly, the present invention is directed to the alignment of a component within an optoelectronic device so as to provide for efficient assembly of the device.

2. The Related Technology

Fiber-optics and optoelectronics are important aspects of modern optical networks because they allow for efficient, accurate and rapid transmission of optical data between various components in the network system. Optical transceiver modules ("transceivers") are an example of modular components used in optical networks. Such modular component are desirable in optical networks and other fiber optic systems to reduce the cost of manufacturing the system, which cost increases the more customized the system becomes.

Transceivers usually include an input receiver optical subassembly ("ROSA") and an output transmitter optical subassembly ("TOSA"). The ROSA includes a photodiode for detecting optical signals and sensing circuitry for converting the optical signals to digital signals compatible with other network components. The TOSA includes a laser for transmitting optical signals and control circuitry for modulating the laser according to an input digital data signal. The TOSA has an optical lens for focusing the optical signals from the laser of the TOSA into an optical fiber. Similarly, the ROSA often includes a lens to focus incoming optical signals on the photodiode. Additionally, one end of the transceiver includes pluggable receptacles, pig-tailed connections, or other suitable means for optically connecting the TOSA and the ROSA with other components within a fiber optic network, while another end often includes a connector for connecting with electrical components of a host system or device with which the transceiver communicates.

The photodiode in the ROSA and the laser in the TOSA are examples of optoelectronic semiconductor components. Generally, these optoelectronic semiconductor components are sensitive devices that require mechanical and environmental protection. As such, these optoelectronic components are usually manufactured in packages to provide such protection and to facilitate their incorporation into higher level devices, such as TOSAs and ROSAs.

One such packaging assembly is known as a transistor-outline header or transistor-outline package, referred to herein as a TO package or TO can. TO packages are widely used in the field of optoelectronics, and may be employed in a variety of applications. As such, TO packages are often standardized to facilitate their incorporation into components such as transceivers. The TO packages protect the sensitive electrical devices contained therein and electrically connect such devices to external components such as printed circuit boards ("PCB").

With respect to their construction, the TO packages often include a cylindrical metallic base, also known as a header, with a number of conductive leads extending completely through, and generally perpendicular to, the base. The size of the base is often sized to fit within a specific TO standard size and lead configuration, examples of which include a TO-5 or TO-46. The leads are usually hermetically sealed in the base to provide mechanical and environmental protection for the components contained in the TO package, and to electrically isolate the conductive leads from the metallic material of the base. Typically, one of the conductive leads is a ground lead that may be electrically connected directly to the base.

Various types of electrical devices and optical components, such as the photodiode or laser device, are mounted on an interior portion of the base and connected to the leads to enable their operation. Generally a cap, also known as a can, is used to enclose the interior portion of the base where such electrical devices are mounted so as to form a hermetic chamber that helps prevent contamination or damage to the devices. The specific design of the TO package depends on the optoelectronic component being mounted on the base and the modular component with which the TO package will be used. By way of example, in applications where the optoelectronic component mounted on the base is an optical component, i.e., a laser or photodiode, the cap is at least partially transparent so to allow an optical signal generated or received by the optical component to be transmitted to or from the TO package. These optical TO can packages are also known as window cans.

In the case of mounting optical components within a window can or other TO package within an optical subassembly, various challenges are often encountered. One challenge deals with accurately positioning the optical component, such as a laser or photodiode, accurately with respect to another component, such as the lens, which may be included in, or proximate to, the package in the optical subassembly. Such positioning is critical to ensure that the optical signals are properly collimated or otherwise focused upon entry to or exit from the optical transceiver module or related device.

In light of the above, a need exists for a means by which a laser, photodiode, or other component can be properly positioned in an optoelectronic or other package such that operation of the device in which the component is disposed is optimized.

BRIEF SUMMARY

The present invention has been developed in response to the above and other needs in the art. Briefly summarized, embodiments of the present invention are directed to an optoelectronic device that employs a composite adhesive to properly position optical components within the device. In one embodiment, an optical subassembly is disclosed, comprising a package housing, an optical component, and a composite adhesive that at least indirectly maintains the optical component in a predetermined position on a mounting surface within the package housing. The composite adhesive includes an adhesive substance, and a plurality of spacing elements intermixed in the adhesive substance, wherein the spacing elements at least indirectly space the optical component from a designated surface of the package housing such that the component is positioned in the predetermined position.

In yet another embodiment, a method of positioning a first component with respect to a second component in an optoelectronic package is disclosed. The method comprises determining a desired position of the first component with respect to the second component, then determining an amount of spacing between the first component and the mounting surface that is required to position the first component at the desired position. The method further comprises employing a composite adhesive having a plurality of spacing elements intermixed therein to position the first component at the desired position.

These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SELECTED EMBODIMENTS

Reference will now be made to figures wherein like structures will be provided with like reference designations. It is understood that the drawings are diagrammatic and schematic representations of exemplary embodiments of the invention, and are not limiting of the present invention nor are they necessarily drawn to scale.

FIGS. 1-6 depict various features of embodiments of the present invention, which is generally directed to the alignment of an optical or optoelectronic component, such as a laser die or photodiode, within an optical device in such a way as to simplify both the assembly of the device as well as the manufacture of its constituent parts. This, in turn, can reduce costs associated with the manufacture of optical devices that benefit from the teachings contained herein.

Figure 1:
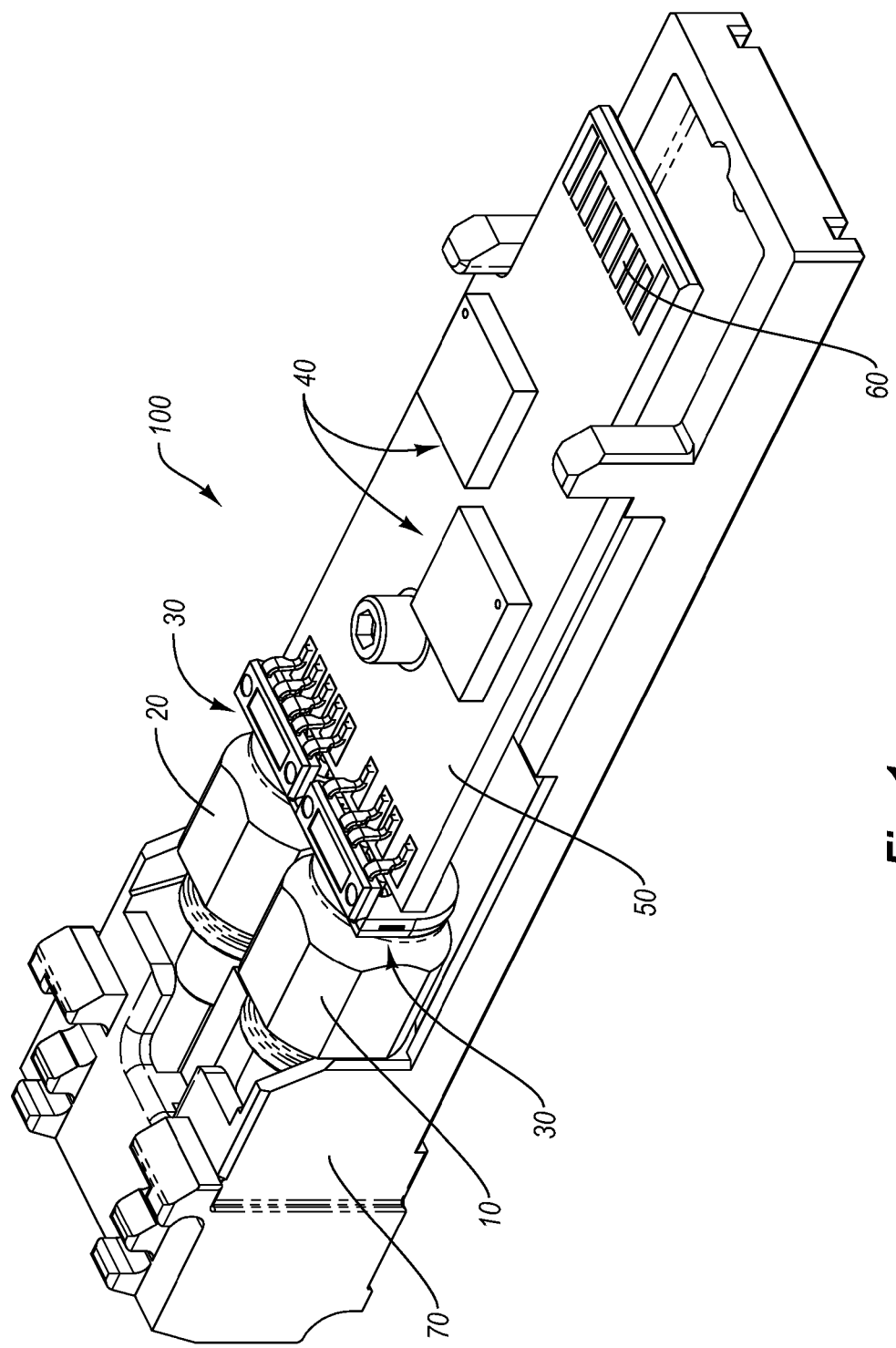
FIG. 1 is a perspective view of an exemplary optical transceiver module, in which one embodiment of the present invention can be practiced.

Reference is first made to FIG. 1, which depicts a perspective view of an optical transceiver module ("transceiver"), generally designated at 100, for use in transmitting and receiving optical signals in connection with an external host that is operatively connected in one embodiment to a communications network (not shown). As depicted, the transceiver shown in FIG. 1 includes various components, including an optical receiver implemented as a receiver optical subassembly ("ROSA") 10, an optical transmitter implemented as a transmitter optical subassembly ("TOSA") 20, electrical interfaces 30, various electronic components 40, and a printed circuit board 50. In detail, two electrical interfaces 30 are included in the transceiver 100, one each used to electrically connect the ROSA 10 and the TOSA 20 to a plurality of conductive pads located on the PCB 50. The electronic components 40 are also operably attached to the PCB 50. An edge connector 60 is located on an end of the PCB 50 to enable the transceiver 100 to electrically interface with a host (not shown here). As such, the PCB 50 facilitates electrical communication between the ROSA 10/TOSA 20, and the host. In addition, the above-mentioned components of the transceiver 100 are partially housed within a housing portion 70. Though not shown, a shell can cooperate with the housing portion 70 to define a covering for the components of the transceiver 100.

Figure 2A:
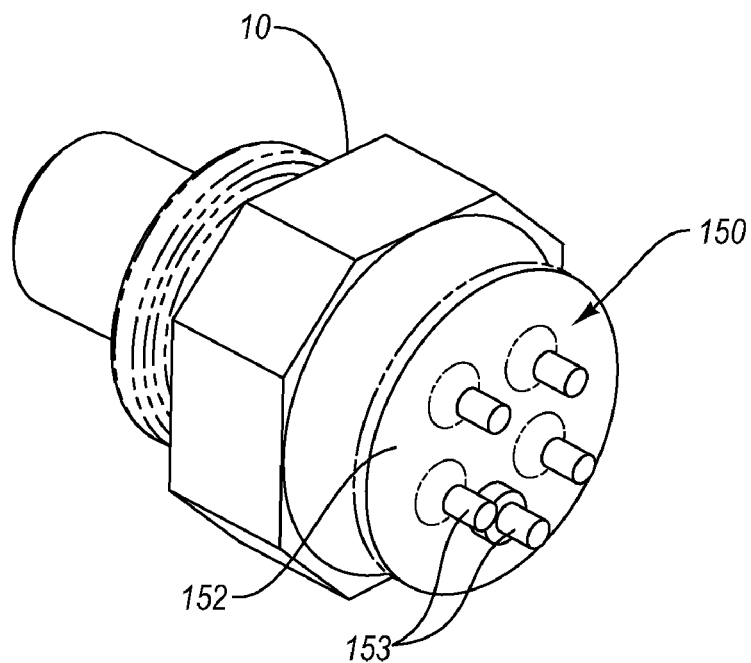
FIG. 2A is a perspective view of an optical subassembly including one embodiment of the present invention.
Figure 2B:
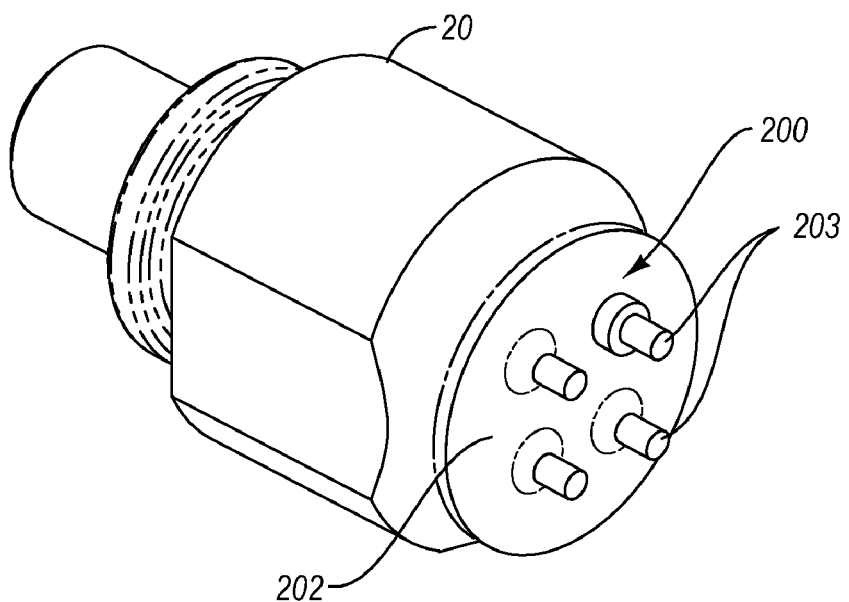
FIG. 2B is a perspective view of another optical subassembly including one embodiment of the present invention.

Reference is now made to FIGS. 2A and 2B. As will be described, the TOSA 20 and ROSA 10 are examples of components within an optical device, such as the transceiver 100, that can benefit from the alignment principles to be discussed herein in connection with embodiments of the invention. In particular, the TOSA 20 generally includes an optoelectronic package that houses a laser die, to be described below, for producing an optical signal in connection with transceiver operation. Similarly, the ROSA 10 includes an optoelectronic package that houses a photodiode (not shown) for receiving an optical signal in connection with transceiver operation. As a prerequisite for their proper operation in transmitting and receiving optical signals, the laser die and the photodiode must be properly aligned with respect to other components within their respective packages. The principles of the present invention provide for such alignment in the direction of light propagation or reception, referred to herein as the z-axis direction (see coordinate axes in FIG. 3A).

Notwithstanding the above discussion, it should be remembered that the present invention can be practiced in connection with a variety of other optoelectronic components and optical devices, or with optical subassemblies that vary in structure or design from that depicted herein. Thus, the discussion presented herein should not be construed to limit the present invention in any way.

As mentioned above, the ROSA 10 includes as part of its structure an optoelectronic TO header package ("package") 150 containing one or more optical components. In the present embodiment, the package 150 of the ROSA 10 includes a photodiode (not shown) configured to receive and sense optical signals received by the ROSA for conversion into electrical signals. This configuration is commensurate with use of the ROSA within the transceiver 100.

Similarly, the TOSA 20 includes an optoelectronic TO header package ("package") 200 containing a laser die (not shown here) that is configured to produce an optical signal containing digital data for transmission onto an optical fiber. As such, the packages 150 and 200 serve as examples of an optoelectronic device for use with embodiments of the present invention. In addition, other devices can benefit from the principles contained herein. As such, the features of the ROSA 10 and TOSA 20, together with their corresponding packages, are not necessarily significant to this particular invention, but are provided for purposes of enablement.

In detail, the package 150 of the ROSA 10 includes a base 152 through which extends a plurality of conductive leads 153. Each lead 153 is electrically isolated from the base 152 by glass seals. The leads 153 serve to electrically interconnect components contained in the package 150, such as the photodiode referred to above, with components, supplies, etc., that are located outside of the ROSA 10. In one embodiment, the leads 153 are in electrical communication with the PCB 50 via one of the connectors 30.

Similarly, the package 200 of the TOSA 20 includes a base 202 through which extends a plurality of conductive leads 203, insulated by corresponding glass seals. As with the package 150, the leads 203 of the package 200 serve to electrically interconnect components contained in the package 150, such as the laser die or other light emitter referred to above, with components located outside of the TOSA 20, such as the PCB 50 via one of the connectors 30.

Figure 3A:
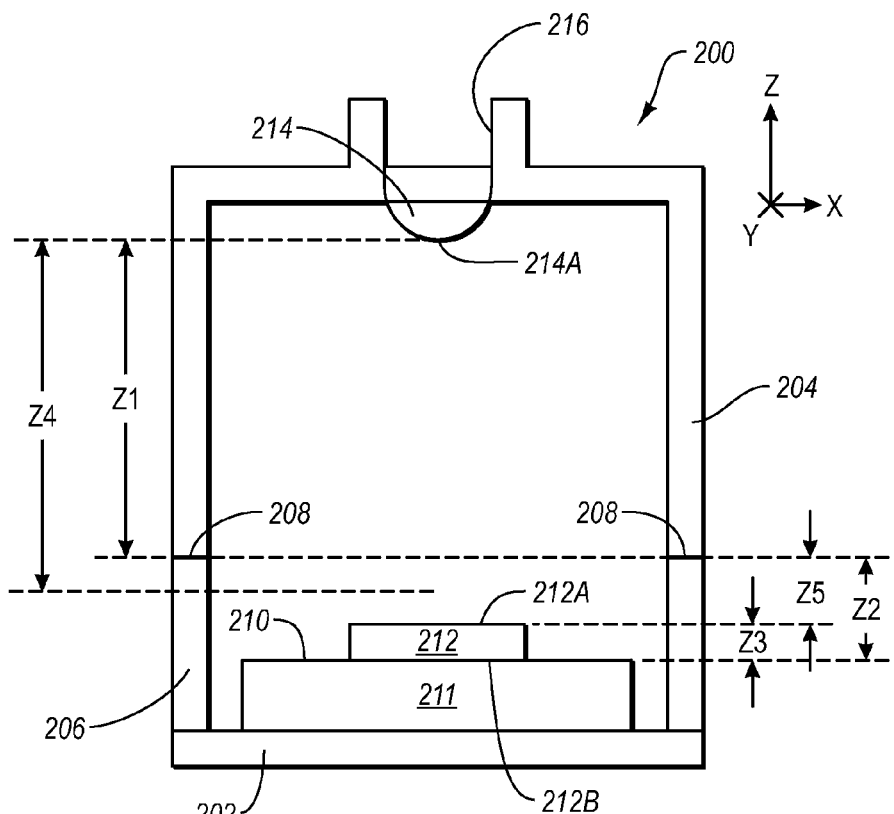
FIG. 3A is a partial cutaway view of an optical package, including a laser die that can be properly aligned in accordance with one embodiment of the present invention.

Reference is now made to FIG. 3A in describing various details regarding one embodiment of the present invention. In detail, FIG. 3A shows, in simplified block form, an optoelectronic package that forms a part of an optical subassembly. In the illustrated embodiment, the package is configured as the laser die-containing housing, or package 200, which forms part of the TOSA 20, as described above. The laser package 200 includes a first package portion 204 and a second package portion 206 that correspondingly mate with one another to form the package. It should be noted that, while it is shown to have a particular configuration, the package 200 is merely representative of the variety of package shapes and configurations in which principles of the present invention can be practiced. For instance, the package could be formed from one, two, or more portions, and the portions could vary in size and design from that which is shown in FIG. 3A. Additionally, as has already been described, principles of the present invention can be practiced in connection with other components, such as the ROSA 10 shown in FIG. 2A, or other devices.

As shown in FIG. 3A, in one embodiment the first package portion 204 and second package portion 206 are mated with one another at a mating interface of both portions. The mating interface corresponds with a package reference 208 that is defined at the interface of the first and second package portions 204 and 206. The package reference 208 is used in the present embodiment to assist in aligning an optical component of the laser package 200 using the alignment procedures described below. Note that, though the package reference 208 of the embodiment shown in FIG. 3A is defined by the interface between the first package portion 204 and the second package portion 206, other package references could be defined in addition to or instead of the one shown here. For instance, the first and second package portions could each include one of two inter-engaging cylinders, wherein one cylinder ("inner cylinder") fits within the other cylinder ("outer cylinder") upon mating of the first and second package portions. The outer cylinder can include a shoulder for providing a secure and accurate fit between the two cylinders, thereby providing a good mechanical attachment of the package portions and a package reference in accordance with embodiments of the present invention.

The package 200 further provides a location for the positioning and placement of an optical component. Specifically, FIG. 3A shows a mounting surface 210 positioned on a submount 211 included with the second package portion 206. The submount 211 can be attached to a portion of the second package portion 206, such as to the base 202 thereof, or it can be integrally formed with the second package portion. Alternatively, the submount can be omitted such that the mounting surface is defined on the base 202 or other suitable surface. The mounting surface 210 is suitably shaped to receive an optoelectronic component of the laser package 200. In the present embodiment, the optoelectronic component is a laser die 212. FIG. 3A shows the laser die 212 temporarily resting on the mounting surface 210 before being permanently affixed thereto via an adhesive to be described below. As such, the mounting surface 210 serves as a permanent base for the laser die 212. Note that the mounting surface 210 can have a variety of shapes and configurations in accordance with the needs of the package. For instance, a lead frame can be positioned to interconnect with the laser die 212 via wire bonds or other suitable means once the die is permanently affixed, as described below.

The second package portion 206 includes a focusing element, such as a lens 214. The lens 214 is positioned adjacent an outlet 216 that enables an optical signal produced by the laser die 212 and focused by the lens to exit the laser package 200. As such, the laser die 212 and the lens 214 are aligned with respect to one another and with respect to the outlet 216. In another embodiment, the lens can be positioned as a component separate from the package 200.

In the configuration shown in FIG. 3A, the laser die 212 is a vertical cavity surface emitting laser ("VCSEL"), and as such emits light from an emitting surface 212A that is substantially parallel to the mounting surface 210. Thus, optical signals emitted by the emitting surface 212A of the VCSEL laser die 212 in this embodiment propagate in the z-axis direction as indicated by the coordinate axis in FIG. 3A. Note that other lasers and light emitting semiconductors, such as LED's and edge-emitting lasers, can also be used in connection with embodiments of the invention, as appreciated by one skilled in the art.

In the configuration of the laser package 200 shown in FIG. 3A, several pertinent dimensions can be defined in the z-axis direction in order to provide data for the proper z-axis alignment of the laser die 212 in accordance with embodiments of the present invention. A distance in the z-axis direction between an optical input side 214A of the lens 214 and the package reference 208 is defined as a distance Z1. Similarly, a distance in the z-axis direction from the mounting surface 210 on the second package portion 206 and the package reference 208 is designated as Z2. The thickness of the laser die 212 in the z-axis direction is designated as Z3. And an optimum distance between the laser die 212 and the input side 214A of the lens 214 in the z-axis direction is designated Z4. A dimension Z5 defines the distance between the package reference 208 and the emitting surface 212A of the laser die 212 before the laser die is desirably positioned at the optimum distance Z4 and adhered to the mounting surface 210.

As shown in FIG. 3A, the emitting surface 212A of the laser die 212 may be at a level that is initially below the optimum distance from the lens input side 214A, indicated at Z4, after initial assembly of the laser package 200 is complete. Embodiments of the present invention are designed to eliminate this discrepancy in order to provide optimum laser die-to-lens spacing. Again, though the present embodiment shows a laser die and a lens, other optoelectronic and optical components can be desirably aligned using the principles of the present invention, including photodiodes associated with a receiver optical subassembly.

Figure 4:
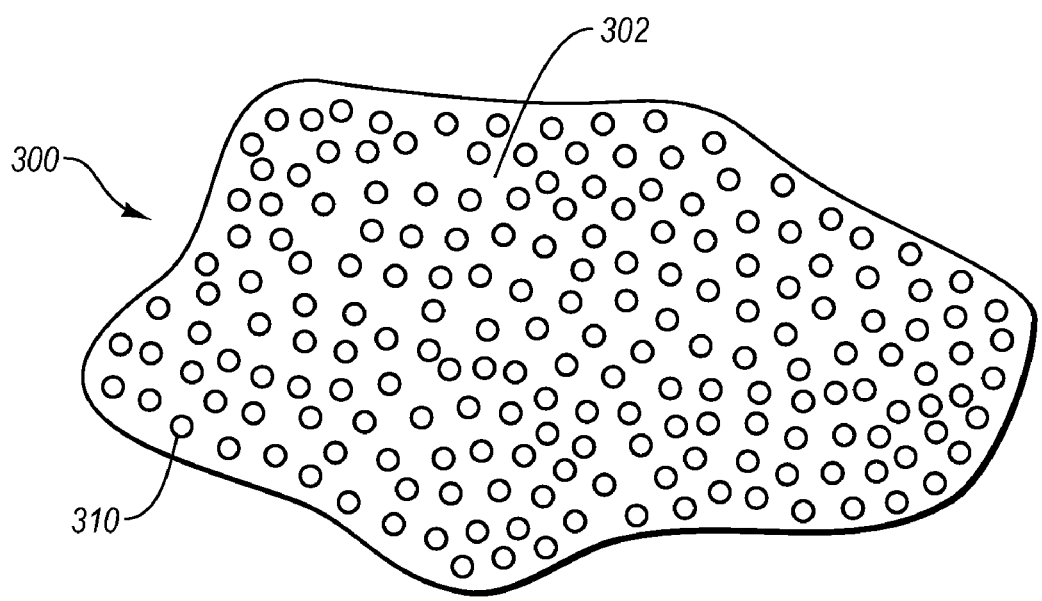
FIG. 4 is a perspective view of a composite adhesive that is employed in aligning the laser die of FIG. 3B.

Reference is now made to FIG. 4, which shows a composite adhesive 300 that is employed in connection with embodiments of the present invention in order to provide proper alignment between optoelectronic components in a package. The composite adhesive 300 is composed of an adhesive substance 302, such as epoxy, acrylic, solder, or adhesive film that can properly affix an optical component, such as the laser die 212, to a mounting surface, such as the mounting surface 210 of the submount 211 (FIG. 3A). In addition, as shown in FIG. 4 the composite adhesive 300 further includes various spacing elements, or spheres 310, that are intermixed in the adhesive substance 302. As mentioned, the spheres 310 of the composite adhesive 300 serve as spacing elements to provide proper spacing between a mounting surface and an optical component during alignment procedures for a package, such as the laser package 200 shown in FIG. 3A. Details concerning the use of the composite adhesive 300 in this manner are discussed further below.

The spheres 310 that are intermixed with the adhesive substance 302 in one embodiment are composed of a suitable material, such as glass or plastic. Preferably, the material from which the spheres 310 are manufactured is substantially rigid such that substantial compression or breakage of the spheres under a nominal force, such as a force used to position the optoelectronic component, does not occur. In addition to glass or plastic, various other suitable materials can be used to form the spheres 310, as appreciated by those skilled in the art, and in accordance with the intended use of the package. For instance, certain optoelectronic components can produce substantial quantities of heat; thus, in such a case the spheres 310, as well as the adhesive substance 302 should be formed of a material that is sufficiently heat resistant so as not to deform or break down. In yet another embodiment, compressible spacing elements can alternatively be employed in the composite adhesive, if desired for a particular application.

In one embodiment, the spheres 310 of the composite adhesive 300 are uniformly sized so as to provide uniformity in the alignment of optoelectronic components using the composite adhesive. Thus, as shown in FIG. 4, each sphere has a uniform radius with respect to the other spheres 310 in the composite adhesive 300.

In addition, the present embodiment of the composite adhesive 300 includes sphere-shaped spacing elements represented by the spheres 310. However, in other embodiments it may be desirable or advantageous to employ spacing elements having shapes other than spheres, such as cubes, triangles, ovals or ellipses of revolution, etc. Use of such spacing elements, however, is dependent on the intended application. In the present embodiment, sphere-like spacing elements, such as the spheres 310, afford various advantages in connection with their use in the composite adhesive 300, including ease of positioning an optoelectronic component, such as the laser die 212, when in contact with the composite adhesive.

Figure 3B:
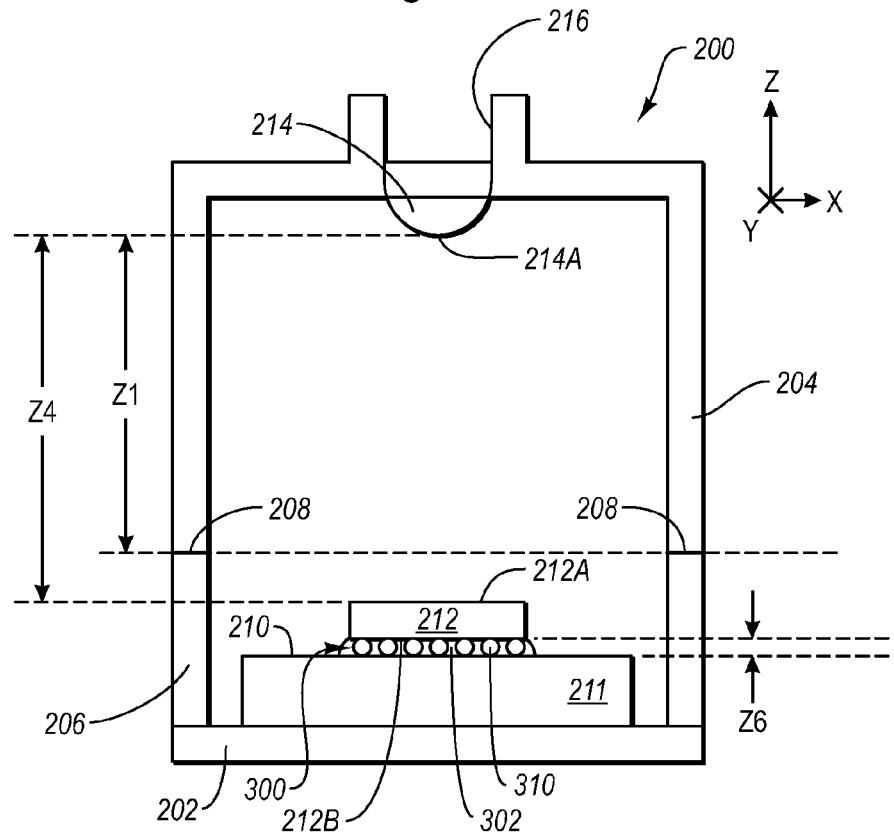
FIG. 3B shows the optical package of FIG. 3A, having the laser die desirably positioned in accordance with one embodiment.

Reference is now made to FIG. 3B, which depicts use of the composite adhesive 300 in properly aligning in a z-axis direction an optical device in a package, such as the laser die 212 in the laser package 200. As such, FIG. 3B is a successive view of the laser package 200 of FIG. 3A, following application of alignment procedures of the present invention in accordance with one embodiment thereof As shown, the laser die 212 is affixed to the mounting surface 210 of the submount 211 of the second package portion 206 via the composite adhesive 300. Placement of the laser die 212 on the mounting surface 210 is such that its emitting surface 212A is positioned a distance Z4 from the input side 214A of the lens 214. Advantageously, the distance Z4 between the laser die 212 and the lens 214 represents an optimum orientation in the z-axis direction of the laser die with respect to the lens.

As previously mentioned, alignment of the laser die 212 shown in FIG. 3B is accomplished by detailed measurement of the various dimensions of the laser package 200 and associated components indicated by dimensions Z1-Z6 (dimension Z6 is explained below), and by employing the composite adhesive 300 discussed above. In detail, after initial assembly of the laser package 200 and temporary placement of the laser die 212 on the mounting surface 210 of the second package portion 206, the laser package is inspected using a suitable method or device or method to determine the values of the various dimensions Z1-Z6 that are shown in FIG. 3A. This can be accomplished using an imaging camera or other optical apparatus. The laser die 212 can be initially placed in the laser package 200 and measured in place in order to determine dimension Z3 (FIG. 3A). Alternatively, the dimension Z3 of the laser die can be measured while not residing in the package, e.g. in a shipping container or on a flat surface outside of the package. In one embodiment the dimension Z5 can be determined by subtracting the value of Z3 from the value of Z2. In another embodiment, however, Z5 can be optically measured independently of other measurements.

In one embodiment, dimensions Z1-Z3 can be used to determine the value of the desired dimension Z4 to provide an optimum spacing between the lens 214 and the emitting surface 212A of the laser die 212. In another embodiment, dimension Z4 can be determined independent of the other dimensions. It yet another embodiment, the dimension Z4 can be determined using dimensions or techniques beyond those discussed herein, as appreciated by those skilled in the art.

Determination of Z4 enables in turn the determination of the additional spacing between the mounting surface 210 and the bottom surface 212B of the laser die 212 that is needed to desirably align and position the laser die with respect to the direction of light propagation, i.e., the z-axis. The additional spacing needed is indicated in FIG. 3B as dimension Z6, and in one embodiment is determined by the formula Z6=Z4-(Z1+Z5). In addition, and has been described in connection with the other dimensions, dimension Z6 can be determined using other means and/or techniques. As such, dimension Z6 can be considered to define the amount of alignment error in the z-axis direction to be corrected by use of the composite adhesive 300. It is further noted here that consideration should be made in determining and using the various dimensions noted herein of any additional discrepancy that may be introduced by the thickness of typical adhesive that is used to bond the first and second package portions 204 and 206 together at their mutual interface, in this case, the package reference 208.

Once dimension Z6 is determined, the sphere-filled composite adhesive 300 is used to properly align and position the laser die 212 within the laser package 200 with respect to the lens 214 in the z-axis direction. In particular, a composite adhesive is selected having spheres intermixed therein that correspond in size to the required spacing defined by dimension Z6. The laser die 212, if present on the mounting surface 210, is temporarily removed from the package 200, and a predetermined amount of the composite adhesive 300 is then applied to the mounting surface 210, as shown in FIG. 3B. Again, the diameter of the spacing elements or spheres 310 in the applied composite adhesive 300 is equal to the height corresponding to Z6 that was previously calculated as needful in order to bring the emitting surface 212A to a distance Z4 from the input side 214A of the lens 214. Subsequently, the laser die 212 is repositioned on the composite adhesive 300 that was applied on the mounting surface 210, and sufficient downward pressure is placed on the laser die 212 in order to compress the adhesive such that a single row of spheres 310 are interposed between a bottom surface 212B of the laser die 212 and the mounting surface 210. Compression in this regard insures that the emitting surface 212A of the laser die 212 is positioned at the proper distance Z4 in the z-axis direction from the lens input side 214A, in accordance with the principles of the present invention.

It can be appreciated that the composite adhesive 300 containing the spheres 310 can be modified in accordance with the spacing needs of the particular optoelectronic component within the package. As such, if greater separation between the mounting surface and the laser die or other optoelectronic component is desired, the adhesive can be prepared having spheres of a relatively larger size than those shown in FIG. 3B. Correspondingly, should less separation be desired, a composite adhesive having smaller spheres intermixed therein can be prepared and used. Thus, the present composite adhesive solution can be modified to include uniformly sized spheres of one of a variety of sizes so as to match a particular spacing need within the package.

In typical manufacturing and assembly lines for packages, the relative sizes and fit of the respective components of the package or optoelectronic component can vary according to part, due to tolerances and other manufacturing variances that are inherent in the manufacturing and assembly process. For instance, the package 200 shown in FIG. 3A can possess dimension Z1 and Z2 that vary from a subsequent package manufactured using the same process. Or, laser dies may vary in their thickness Z3 from die to die. Embodiments of the present invention are designed to compensate for this variance. In detail, multiple composite adhesive mixtures can be formulated, each adhesive mixture containing distinct, uniformly sized spheres of a predetermined size. Thus, a plurality of composite adhesives, each having distinct sphere sizes can be prepared and be on hand during the assembly process of the package. Thus, when a package having a spacing requirement corresponding to a particular dimension Z6 is encountered, a composite adhesive having spheres that will raise the optoelectronic component as needed to provide the desired spacing Z4 can be used. Correspondingly, in a subsequent package having a spacing requirement corresponding to a different dimension Z6, an alternative composite adhesive having spheres that possess a diameter that corresponds to the subsequently desired spacing to provide the dimension Z4 can be used. In this way, z-axis alignment of the optoelectronic component can be achieved regardless of the spacing needs encountered within the package. This in turn enables the components of the package to be manufactured with relatively less strict tolerances than would otherwise be required, thereby reducing overall manufacturing and assembly costs and providing production cost savings to the manufacturer. In addition, use of the composite adhesive can be readily implemented without the addition of new assembly devices in one embodiment, as semiconductor devices such as the laser die are typically adhered using simple adhesives.

Inspection of FIG. 3B will reveal that the spheres 310 are relatively small compared to the surface area of the laser die bottom surface 212B. Such a size differential it between the optoelectronic component and the spacing elements of the adhesive is desirable in one embodiment in order to provide contact between a suitable number of the spheres 310 and a surface of the component. Thus, in one embodiment the size of the spacing elements in the adhesive can be dictated at least in part by the overall surface area of the optoelectronic component that is to be bonded by the adhesive.

Figure 5:
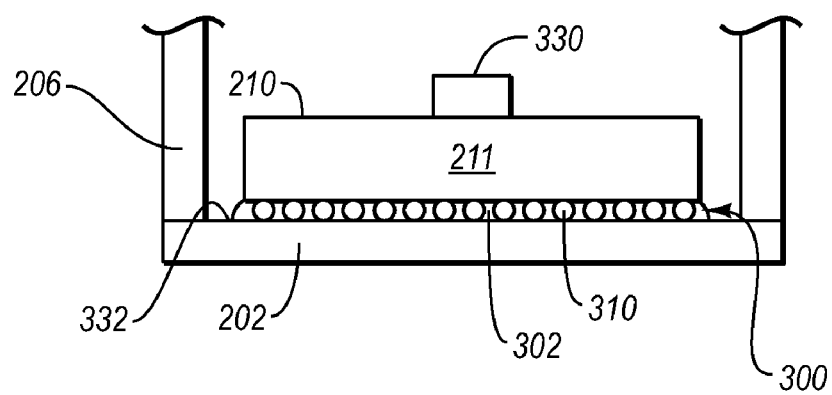
FIG. 5 is a cutaway view of a portion of the optical package of FIG. 3A, showing yet another embodiment of the present invention.

Reference is now made to FIG. 5. In some instances, the size of the optical component, such as an optical component 330, is sufficiently small that use of the composite adhesive 300 to adhere the component directly to the mounting surface 210 is impractical. In such a case, the component 330 can be adhered to the mounting surface 210 of the submount 211 using known bonding methods. The submount 211 can then be bonded to a portion of the second package portion 206, such as an interior base surface 332, using the composite adhesive 300. The size of the spacing elements 310 corresponds with the amount of additional height required to bring a specified portion of the component 330 to a proper level within the package. Thus, the composite adhesive is used at least indirectly to position the component at a proper location within the package, in accordance with embodiments of the present invention.

Figure 6:
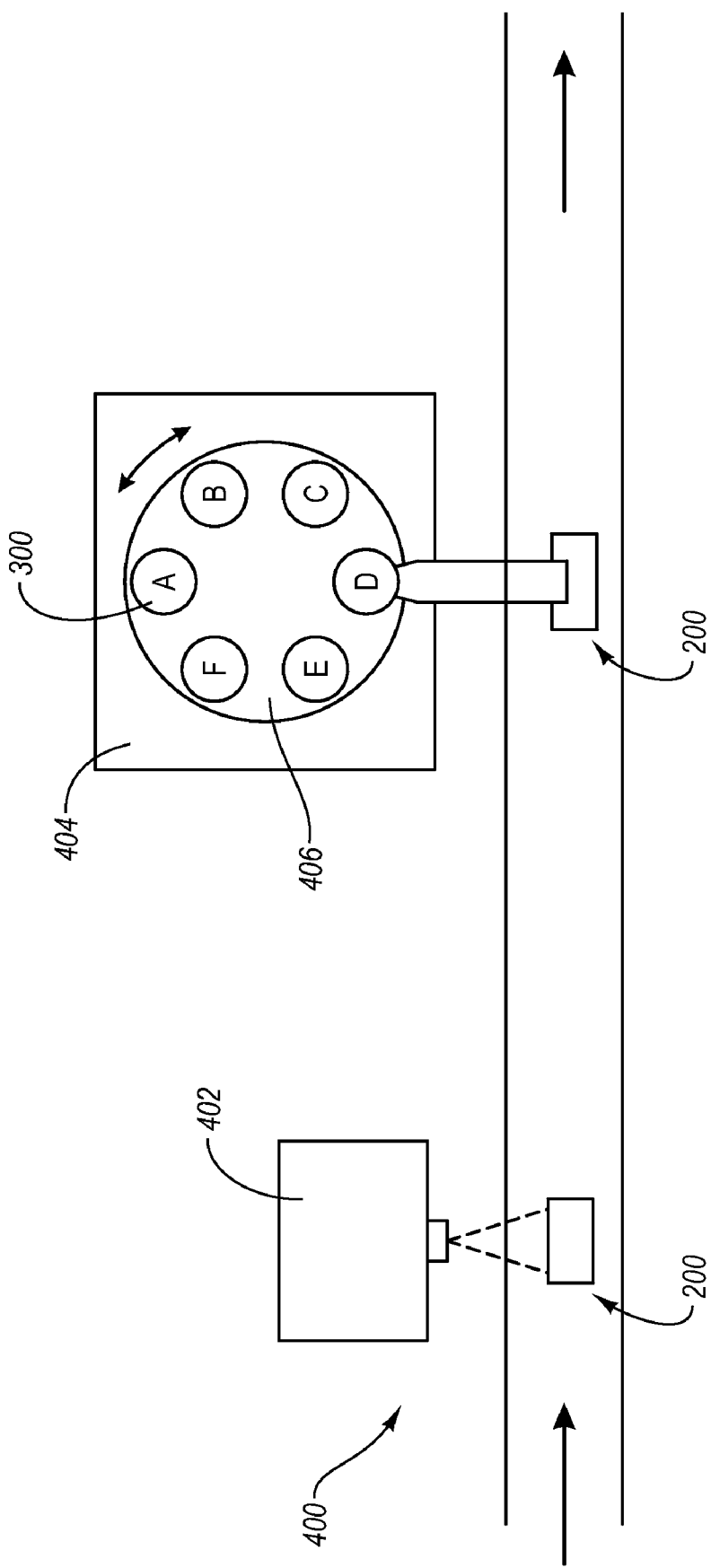
FIG. 6 is a simplified block diagram of a system for applying the composite adhesive of FIG. 4 to an optoelectronic device, according to one embodiment.

Reference is now made to FIG. 6, which shows various details of one embodiment of a process by which optoelectronic components can be properly aligned within a package. Note, however, that FIG. 6 and the accompanying description depicts only certain details of the above process, and is not meant to include an exhaustive enumeration of a method for manufacturing an optical package. Further, principles of the present invention can be practiced using methods and components that vary from that to be described below. The following discussion should not, therefore, be construed as limiting of the present invention.

In detail, FIG. 6 shows a plurality of packages, such as the package 200 shown in FIGS. 3A and 2B, in a manufacturing and assembly process conducted in part by an alignment system 400. As depicted, in one embodiment the laser package 200 can be imaged by an optical measurement device of the system 400, such as a camera 402. The camera 402 is equipped to image portions of the laser package 200 in order to ascertain some or all of the various dimensions Z1-Z6 as detailed above, and as shown in FIG. 3 A. Selected dimensions of the dimensions Z1-Z6 can be alternatively measured in other ways. Once the proper dimensions have been ascertained by the camera 402 or other suitable means, the laser package 200 can proceed to an adhesive dispenser 404.

In one embodiment, the adhesive dispenser 404 can contain composite adhesives 300A-F. Each of the composite adhesives 300A-F contains spheres that are uniquely sized with respect to the spheres of the other composite adhesives, thereby providing solutions for each of a plurality of possible spacing needs for the laser die 212 with respect to a lens or other component of the laser package, as previously discussed (see FIGS. 3A, 3B). In one embodiment, for instance, the diameter of spherical spacing elements used in separate composite adhesives can range from about 10 to 100 microns. Thus, the system 400 can adequately align the laser die 212 within the laser package 200 by first ascertaining the need for proper spacing via the determination of the various dimensions Z1-Z6 (FIG. 3A, 3B), then selecting the proper composite adhesive 300A-F from the adhesive dispenser 404.

Once the proper composite adhesive 300A-F is selected, a turntable 406 or similar device or functionality can be activated in order to administer the selected composite adhesive to the proper portion of the laser package 200. The laser die 212 can then be placed atop the applied composite adhesive, then pressed into place in order to interpose a single layer of spheres 310 between the mounting surface 210 and the bottom surface 212B of the laser die (FIG. 3B) and to affix the laser die in a spaced-apart arrangement with respect to the mounting surface at the proper height within the laser package, as desired. The laser package 200 then can proceed as needed for further processing steps, including adhesive curing, inspection, and wirebonding. In addition to the above steps, it is of course necessary to align and affix the first and second package portions 204 and 206 to one another. The alignment of these package portions is an active alignment process in one embodiment.

It is to be noted that the details of the system 400 are merely exemplary, and thus should not be construed as the only manner in which principles of the present invention can be practiced. It should also be remembered that, while the present discussion has focused on the placement of a laser die within a laser package, embodiments of the present invention can be practiced with a variety of optoelectronic components and packages, such as photodiodes placed within ROSA packages, for instance. Thus, this and other applications are contemplated as falling within the claims of the present invention. In another embodiment, the adhesive can be first applied to the proper portion of the package, after which spheres or other spacing elements can be added to the adhesive while still pliable in order to provide the proper spacing for the optoelectronic component when placed in the adhesive. Thus, in such an embodiment, a single adhesive can be used, whereas spheres uniformly separated into a plurality of sizes can be added thereafter.

One advantage of practice of embodiments of the present invention is the fact that the practice of actively aligning the optoelectronic component in the z-axis direction within the package can be reduced or eliminated, thereby representing further cost savings in the manufacture of the package. It should also be noted that embodiments of the present invention can be extended to include location and/or positioning of a lens of a TOSA or ROSA in the case where the position of an optoelectronic component or fiber surface are predetermined.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. A method of positioning a light source or photodiode with respect to a focusing lens of an optical subassembly, the method comprising:
    determining a desired position of the light source or photodiode with respect to the focusing lens;
    determining an amount of spacing between the light source or photodiode and a mounting surface that is required to position the light source or photodiode at the desired position; and
    positioning the light source or photodiode at the desired position with respect to the focusing lens using a composite adhesive having a plurality of spacing elements intermixed therein, the positioning of the light source or photodiode relating to z-axis positions along a direction of light propagation from the light source or photodiode to the focusing lens which is determined by a width of the spacing elements intermixed therein.

2. The method of claim 1, wherein the direction in which the light source or photodiode is positioned includes along a direction of light propagation from the light source or direction of light reception to the photodiode.

3. The method of claim 1, wherein a substantially uniform spaced-apart arrangement between a bottom surface of the light source or photodiode with respect to the mounting surface is provided by the plurality of spacing elements.

4. The method of claim 1, wherein determining the amount of spacing further comprises:
    defining a common reference point with respect to the focusing lens and a mounting surface for the light source or photodiode; and
    measuring the respective distances between the focusing lens and the common reference point and between the mounting surface and the common reference point.

5. The method of claim 4, wherein determining the amount of spacing further comprises measuring a dimension of the light source or photodiode.

6. The method of claim 1, wherein positioning the light source or photodiode comprises interposing the composite adhesive between the light source or photodiode and the mounting surface to space the light source or photodiode from the mounting surface such that the light source or photodiode is positioned at the desired position.

7. The method of claim 1, wherein positioning the light source or photodiode comprises applying an adhesive material proximate the light source or photodiode and subsequently adding the spacing elements to the adhesive material.

8. The method of claim 1, wherein the mounting surface is formed on a package housing of the optical subassembly.

9. The method of claim 1, wherein the spacing elements are substantially spherically shaped.

10. The method of claim 9, wherein the spacing elements have a substantially uniform diameter, the diameter corresponding to the distance between the mounting surface and the light source or photodiode that is needed to achieve the desired position of the light source or photodiode with respect to the focusing lens.

11. The method of claim 1, wherein positioning the light source or photodiode comprises applying the composite adhesive to the mounting surface such that a single layer of spacing elements is interposed between the light source or photodiode and the mounting surface.

12. The method of claim 1, wherein the adhesive substance is selected from the group consisting of epoxy, acrylic, solder, and adhesive film.

13. A method of assembling an optical subassembly, the method comprising:
    providing a package housing;
    providing an optical component having a bottom defining a plane;
    determining a desired position of the optical component with respect to a mounting surface within the package housing, the desired position relating to one of several z-axis positions along a direction of light propagation to the optical component or direction of light reception by the optical component, wherein the mounting surface and the plane defined by the bottom of the optical component are substantially parallel;
    determining an amount of spacing between the optical component and the mounting surface that is required to position the optical component at the desired position; and
    positioning the optical component at the desired position with respect to the mounting surface along the direction of light propagation to the optical component or direction of light reception from the optical component using a composite adhesive having a plurality of spacing elements intermixed therein, wherein the spacing elements at least indirectly space the optical component from the mounting surface within the package housing such that the component is positioned in the desired position.

* * * * *

UNITED STATES PATENT AND TRADEMARK OFFICE
CERTIFICATE OF CORRECTION

PATENT NO. : 7,418,176 B2  Page 1 of 2
APPLICATION NO. : 11/468629
DATED : August 26, 2008
INVENTOR(S) : Rosenberg It is certified that error appears in the above-identified patent and that said Letters Patent is hereby corrected as shown below:

Column 4
Line 1, change "transceiver shown in FIG. 1" to --transceiver 100 shown in FIG. 1--
Line 22, change "transceiver 100," to --transceiver 100 (FIG. 1),--
Line 52, change "transceiver 100," to --transceiver 100 (FIG. 1),--

Column 5
Line 5, change "connectors 30." to --connectors 30 (see FIG. 1).--
Line 10, change "package 150" to --package 200--
Line 13, change "connectors 30." to --connectors 30 (see FIG. 1).--
Line 23, change "form the package." to --form the package 200.--
Line 61, change "second package portion." to --second package portion 206.--
Line 62, change "the submount" to --the sumount 211--

Column 6
Line 8, change "the die" to --the die 212--
Line 13, change "the lens" to --the lens 214--
Line 16, change "the lens" to --the lens 214--
Line 67, change "or spheres 3 10" to --or spheres 310--

Column 7
Line 31, change "In addition, the present embodiment" to --The present embodiment--
Line 42, change "laser die 212" to --laser die 212 (FIG. 3A)--
Line 43, change "adhesive." to --adhesive 300.--
Line 50, change "embodiment thereof As shown," to --embodiment thereof. As shown--
Line 58, change "the laser die with respect to the lens." to --the laser die 212 with respect to the lens 214.--

Column 8
Line 2, change "dimensions Z1-Z6" to --dimensions Z1-Z5--
Line 9, change "In one embodiment" to --In one embodiment,--
Line 26, change "as dimension Z6, and" to --as dimension Z6, and,--

Signed and Sealed this

Twenty-third Day of November, 2010

David J. Kappos
*Director of the United States Patent and Trademark Office*

Line 27, change "in one embodiment" to --in one embodiment,--
Line 27, change "the formula Z6=Z4-(Z1+Z5)." to --the formula Z6=(Z1+Z5)-Z4.--
Line 44, change "adhesive is selected having spheres intermixed" to --adhesive 300 is selected having spheres 310 intermixed-- (<<WHO>>)
Line 58, change "the adhesive" to --the adhesive 300--

Column 9
Line 37, change "This in turn enables" to --This, in turn, enables--
Line 48, change "Such a size differential it between" to --Such a size differential between--

Column 10
Line 1, change "composite adhesive" to --composite adhesive 300--
Line 2, change "the component" to --the component 330--
Line 24, change "FIG. 3 A." to --FIG. 3A--
Line 34, change "to a lens" to --to a lens 214--
Line 52, change "laser die" to --laser die 212--
Line 53, change "mounting surface" to --mounting surface 210--
Line 54, change "package, as desired." to --package 200, as desired (FIG. 3B).--
Line 58, change "to one another." to --to one another (FIG. 3B).--

Column 11
Line 36, change "focusing lens;" to --focusing element;--